United States Patent [19]

Amrany

[11] Patent Number: 5,384,810
[45] Date of Patent: Jan. 24, 1995

[54] MODULO DECODER

[75] Inventor: Daniel Amrany, Wayside, N.J.

[73] Assignee: AT&T Bell Laboratories, Murray Hill, N.J.

[21] Appl. No.: 831,715

[22] Filed: Feb. 5, 1992

[51] Int. Cl.$^6$ .................. H03D 1/00; H04L 27/06
[52] U.S. Cl. ........................... 375/94; 371/43
[58] Field of Search ............ 375/94, 39; 371/43; 329/304

[56] References Cited

U.S. PATENT DOCUMENTS

| | | | |
|---|---|---|---|
| 3,925,611 | 12/1975 | Dennis | 375/39 |
| 4,709,377 | 11/1987 | Martinez et al. | 375/39 |
| 4,959,842 | 9/1990 | Forney, Jr. | 375/39 |

OTHER PUBLICATIONS

"Combined Trellis Coding and DFE through Tomlinson Precoding", Ahmad K. Aman, Robert L. Cupo, and Nikolaos A. Zervos, *IEEE Journal on Selected Areas in Communications*, vol. 9, No. 6, Aug 1991.

"The Viterbi Algorithm", G. David Forney, Jr., *Proceedings of the IEEE*, vol. 61, No. 3, Mar. 1973.

*Primary Examiner*—Tesfaldet Bocure
*Attorney, Agent, or Firm*—Joseph J. Opalach

[57] ABSTRACT

A high-speed convolutional decoder is constructed by performing the transition, or branch, metric calculations in reference to a subset of a constellation, which comprises a plurality of subsets. In addition, any subset can be chosen as the reference subset through the use of "modulo decoding." In a modulo decoder, the constellation space is folded into a modulo set area that is centered around the arbitrarily chosen reference subset. The branch, or transition, metrics are calculated within the modulo set area. As a result, the branch metric computations are only performed on a small area of the signal space, with the result that only one error is extracted, the branch metrics are easily computed, and one slicing is performed—thus reducing overall computation time.

9 Claims, 7 Drawing Sheets

MODULO DECODER

BACKGROUND OF THE INVENTION

The present invention relates to decoding techniques used in data communications.

In a data communications system in which convolutional coding is used, a data receiver typically applies a "maximum likelihood decoding" procedure to a sequence of received signal points in order to estimate the sequence of symbols sent by a data transmitter. Generally, in a convolutional code, the symbol that is output by a data transmitter at a particular point in time is dependent on the state of the code. In other words, a convolutional code can be modeled as a state machine, with each transition between states being associated with the transmission of a particular symbol and the current state being dependent on the previous states of the convolutional code. As a result, any sequence of transmitted symbols, which can also be referred to as a "path," is representative of a particular sequence of state transitions in the convolutional code. Maximum likelihood decoding in the data receiver essentially selects that sequence of symbols that have the largest probability of having been transmitted given the particular received sequence of signal points. Theoretically, the maximum likelihood decoder compares the received signal point sequence to all possible transmitted symbol sequences, or paths, and then makes an estimate as to which sequence of symbols, or path, was transmitted. This type of operation causes the complexity of the maximum likelihood decoder to increase exponentially with the number of possible paths. However, as is known in the art, the complexity of the maximum likelihood decoder is reduced by the use of the "Viterbi algorithm," which has a complexity that only increases at a linear rate.

In the Viterbi algorithm a "branch metric," or a "transition metric," is calculated for each received signal point. The branch metric, or transition metric is essentially a measure of the possible error in the received signal. In a very general sense, the received signal point is compared to all the possible symbols that could have been received at that point in the receiver. However, the Viterbi algorithm does not compare each received signal point sequence to all possible transmitted symbol sequences or paths. The advantage of the Viterbi algorithm is that for each state of the convolutional code only the path that has the smallest cumulative value for the branch metric is retained by the decoder in considering the possible paths for any subsequent received signal points.

Notwithstanding the advantages of the Viterbi algorithm, unfortunately, if the number of states in the convolutional code is large, then the number of branch metric computations that must be made for each received signal point is also large. Moreover, as the data rate increases, the time available to perform the branch metric computation decreases. Consequently, at higher data rates, faster and typically more costly processing circuitry must be used to perform the required multiplications and additions for high-speed decoding.

Before proceeding with a description of an illustrative embodiment, it should be noted that the various digital signaling concepts described herein—with the exception, of course, of the inventive concept itself—are all well known in, for example, the digital radio and voiceband data transmission (modem) arts and thus are not described in detail herein. These include such concepts as multidimensional signaling using 2N-dimensional channel symbol constellations, where N is some integer; trellis coding; fractional coding; scrambling; passband shaping; equalization; etc.

SUMMARY OF THE INVENTION

In accordance with the invention, the time required to perform convolutional decoding is reduced by performing the transition, or branch, metric calculations in reference to a single subset from a constellation comprising a plurality of subsets. As a result, a received signal point is only compared to one symbol from which the remaining transition metrics for the other possible received symbols are calculated—thus simplifying the computations required for the branch metric and, concomitantly, simplifying the design of a convolutional decoder.

In accordance with a feature of the invention, modulo arithmetic is used to further simplify the branch, or transition, metric computations. As a result, a received signal point is folded into a small area—the modulo set area (MSA), which uses one arbitrary symbol as the reference point from which the branch, or transition, metrics are determined. The resulting values that are computed in this "modulo decoder" are not absolute, but are relative to the reference symbol.

In a preferred embodiment of the invention, an arbitrary reference subset symbol is selected from a constellation of symbols to serve as the reference symbol for the transition, or branch, metric calculations. The constellation comprises a plurality of subsets, and each subset comprises a plurality of symbols. A received signal point is then folded into a modulo set area, centered around the reference subset, for calculation of the transition, or branch metrics, from which the closest relative subset to a received signal point is selected. After selection of the closest relative subset, only one slicing operation is performed at the end of the decoding process to pick the actual received symbol.

DETAILED DESCRIPTION

Figure 1:
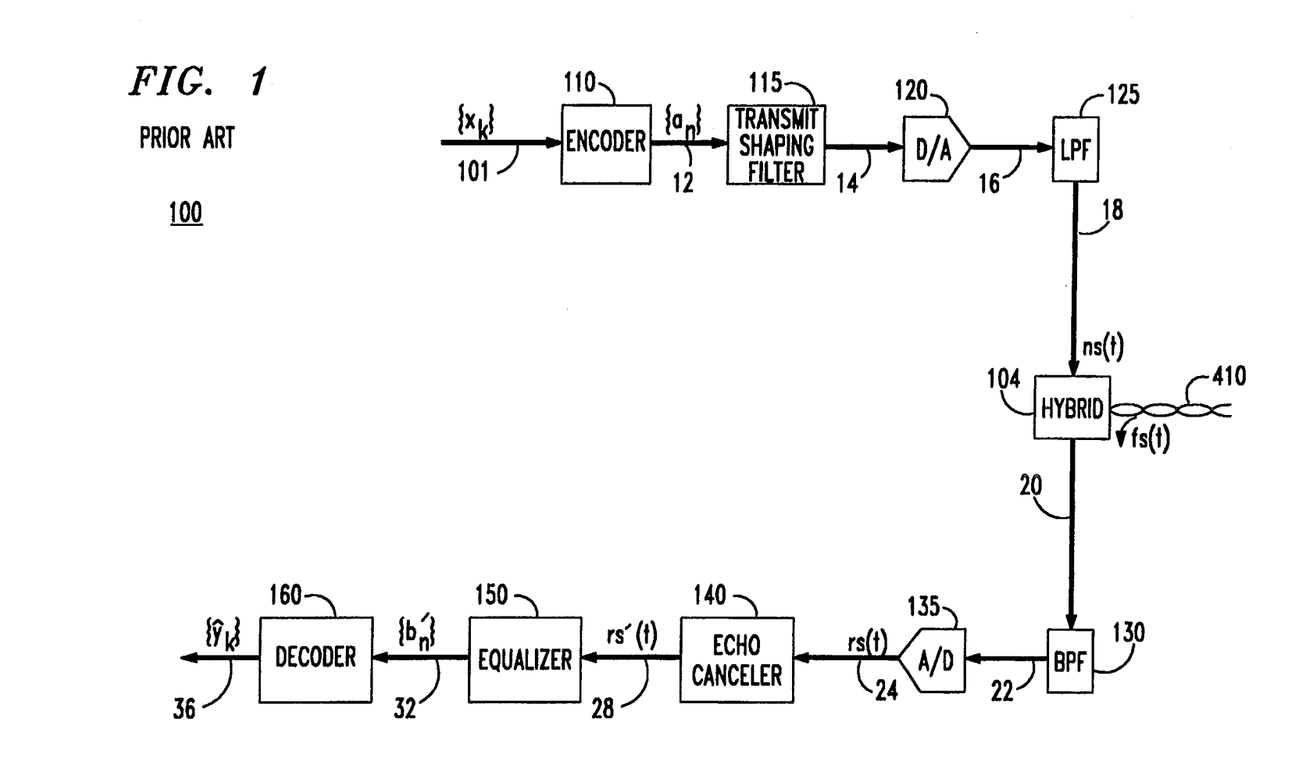
FIG. 1 is a block diagram of a prior art modem structure.

The structure of modem 100 as illustrated in FIG. 1 is representative of prior art echo canceling modems and the operation of the various components is well-known. The binary input data sequence $\{x_k\}$ to modem 100 is first processed by encoder 110, which outputs a sequence of complex-valued symbols $\{a_n\}$, at nominal rate 1/T symbols per second, which are representative of the input data sequence and may also include scrambling, redundancy and other forms of encoding. In the context of this example, it is assumed that encoder 110 implements a convolutional code, e.g., a trellis code. Symbol sequence $\{a_n\}$ is then processed by transmit shaping filter 115, the output of which is applied to analog-to-digital converter (D/A) 120. The resulting analog signal is filtered by low-pass filter (LPF) 125, forming a near-end transmitted signal, ns(t). The later is coupled into channel 410 by hybrid 104. Illustratively, modem 100 employs quadrature amplitude modulation (QAM) and channel 410 is a twisted-pair, or two-wire loop, that is typically connected to a telephone central office (not shown).

Figure 2:
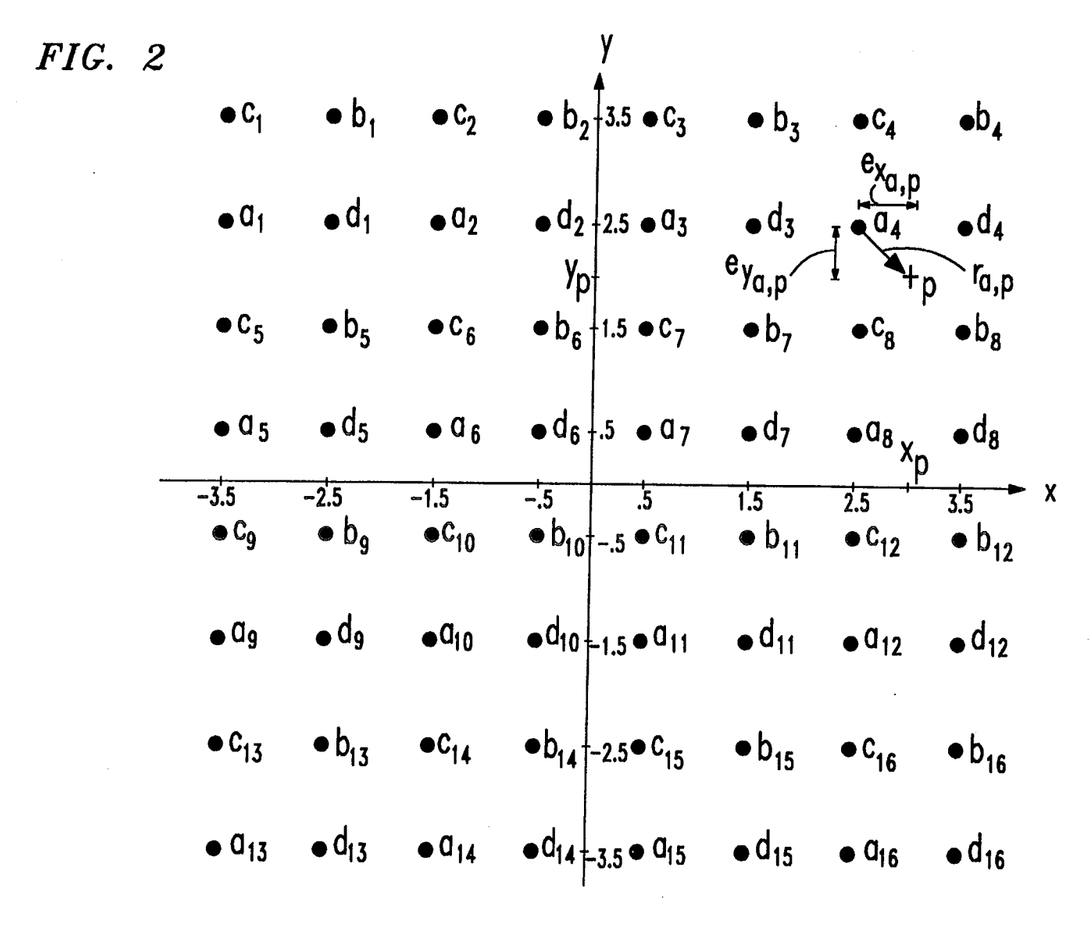
FIG. 2 is an illustrative constellation used in the modem structure of FIG. 1.

For the purposes of this example, it is assumed that the symbol sequence, $\{a_n\}$, comprises symbols taken from a constellation of two-dimensional symbols, which is shown in FIG. 2. Each symbol has an in-phase, or x, coordinate on the horizontal axis and has a quadrature-phase, or y, coordinate on the vertical axis. Further, as can be seen from FIG. 2, the constellation comprises symbols taken from four subsets: a,b,c and d. Consequently, in any particular symbol interval, T, encoder 110 chooses a particular subset, e.g., subset a, and from that subset a particular symbol is then selected for transmission, e.g., $a_2$. In FIG. 2, the illustrative constellation has no bound,tries, that is, it is an infinite grid, which, as known in the art, can be used in conjunction with a Tomlinson precoding technique (e.g., see "Combined Trellis Coding and DFE through Tomlinson Precoding," A. K. Aman, R. L. Cupo, N. A. Zervos, IEEE J. Select. Areas Commun., August 1991).

In the other direction of communication, an analog line signal, fs(t), transmitted from a far modem (not shown) is received by hybrid 104, of FIG. 1, and is directed to bandpass filter (BPF) 130. This signal is referred to as the "far-end data signal," and utilizes the same frequency band as the transmitted signal, ns(t), i.e., modem 100 is a full-duplex modem. Bandpass filter 130 removes energy outside the signal passband from the far-end data signal, which is then converted to digital form by analog-to-digital (A/D) converter 135 to form received signal rs(t). The signal, rs(t), is processed by echo canceler 140, which removes the effects of near and far echoes to provide a substantially echo-free signal, rs'(t). The latter consists primarily of the far-end signal, plus any noise introduced by the channel and the various receiver elements (e.g., quantization error introduced by analog-to-digital converter 135). Further processing of signal rs'(t) is performed by equalizer 150, which compensates for intersymbol interference introduced by channel 410. Equalizer 150 provides signal point sequence $\{b'_n\}$ to decoder 160. As used herein, a signal point represents a transmitted symbol plus any corruption due to noise.

Figure 3:
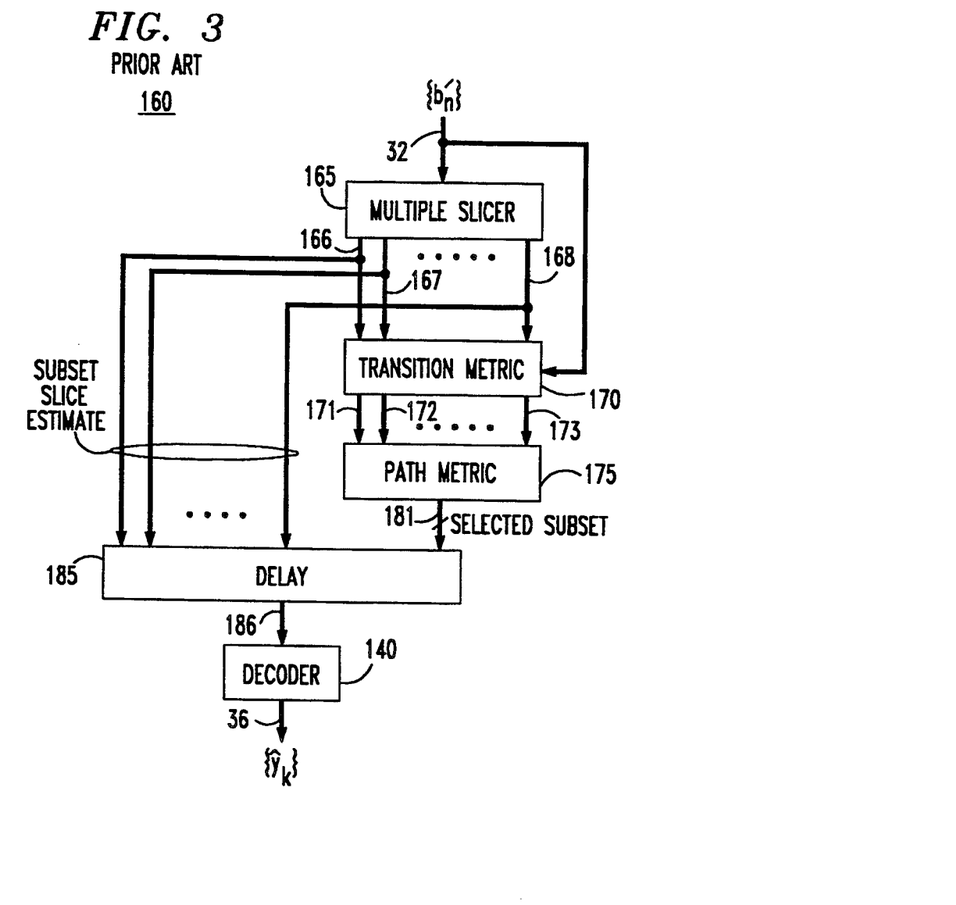
FIG. 3 is a block diagram of a decoder used in the modem structure of FIG. 1.

As is shown in FIG. 3, decoder 160, which implements the Viterbi algorithm, comprises multiple slicer 165, transition metric element 170, path metric element 175, and delay element 185. Since the general Viterbi algorithm itself, other than the inventive concept, is well-known in the art, it will not be described in detail, e.g., see "The Viterbi Algorithm," G. D. Forney, Proceedings of the IEEE, volume 61, number 3, March 1973. Within decoder 160, multiple slicer 165 receives the signal point sequence, $\{b'_n\}$, from equalizer 150 and, as is known in the art, "slices" each received signal point of the sequence to the k closest possible subset symbols, where k is the number of subsets in a symbol period which is illustratively, within the context of this example, equal to four. The results of these multiple slices are four slices, or estimates, of the transmitted symbol $(x_i, y_i)$, which represents the sliced symbol associated with the subset i=a,b,c,d. Only one of these four slices will be chosen as the final estimate for each received signal point. For example, referring to FIG. 2, for an illustrative received signal point p (taken from the received signal point sequence $\{b'_n\}$), with coordinates $x_p, y_p$, the four slices are: $a_4, b_8, c_8$ and $d_4$. These four slices are applied to delay element 185 (discussed below) and are also applied to transition metric element 170, via leads 166 through 168 (i.e., lead 166 delivers the first slice, lead 167 delivers the second slice, etc., up to lead 168 which delivers the last slice).

Transition metric element 170 computes the current transition, or branch, metric for each of the above-mentioned slices with respect to each received signal point. A transition metric is computed by squaring the in-phase and quadrature errors. In other words, the transition metric is the square of the Euclidean distance between a received signal point, e.g., p, and each of the sliced symbols, $(x_i, y_i)$. Specifically, the in-phase error, which is the distance in the in-phase dimension between the respective sliced symbol and the received signal point, is:

$$e_{xi,p} = x_p - x_i, \quad (1)$$

where the subscript x of $e_x$ represents the in-phase error; i=a,b,c,d; $x_p$ is the x-coordinate of the received signal point p; and $x_i$ is the x-coordinate of the respective sliced symbol from subset i. Similarly, the quadrature error is:

$$e_{yi,p} = y_p - y_i. \quad (2)$$

A Euclidean distance is illustratively shown in FIG. 2 for the received signal point p and slice $a_4$ by the vector $r_{a,p}$. Therefore, as defined above, the transition metric $t_i$ for each sliced subset symbol for a received signal point p is equal to:

$$t_{i,p} = e_{xi,p}^2 + e_{yi,p}^2, \quad (3)$$

From equations (1) and (2), equation (3) can be rewritten as:

$$t_{i,p} = (x_p - x_i)^2 + (y_p - y_i)^2, \quad (4)$$

Since $y_p^2$ and $x_p^2$ are common in all terms, an acceptable practice by most designers in the art is to subtract these values from the transition metrics, generating the adjusted transition metric, $t'_i$, which is equal to:

$$t'_{i,p} = x_i(x_i - 2x_p) + y_i(y_i - 2y_p). \quad (5)$$

Regardless of whether equation (4) or (5) is used, there are four slices that must be performed and four calculations, involving, perhaps, large multipliers, in order to determine the value of each transition metric. For example, using equation (5), the following slices and calculations are performed for a received signal point, p:

$$t'_{a,p} = x_a(x_a - 2x_p) + y_a(y_a - 2y_p), \quad (6a)$$

$$t'_{b,p} = x_b(x_b - 2x_p) + y_b(y_b - 2y_p), \quad (6b)$$

$$t'_{c,p} = x_c(x_c - 2x_p) + y_c(y_c - 2y_p), \quad (6c)$$

$$t'_{d,p} = x_d(x_d - 2x_p) + y_d(y_d - 2y_p), \quad (6d)$$

These transitions metrics, $t'_{i,p}$, are applied to path metric element 175, which computes the shortest path, in accordance with the Viterbi algorithm. For example, in a convolutional code comprising a number of states, each state may be reached from any other state by a state transition (which is identified with a particular subset). (For simplicity, it is assumed that every state can be reached from every other state, although this is not probable.) In accordance with the Viterbi algorithm, path metric element 175 does not store each possible sequence of state transitions, or paths, that may have occurred to reach a possible current state over time. Rather, it only stores those paths that have the smallest path metric for each possible current state. In other words, for a current state, there are a number of paths, i.e., subsets, that could have been received to reach the current state over time, however, only that path with the smallest cumulative sum of transition metrics. i.e., the smallest path metric, is retained by path element 175. As a result, upon receiving the transition metrics, $t_{i,p}$, for illustrative signal point p, path metric element 175 computes for each state a new set of path metrics based on having received a symbol for from each of the four subsets {a,b,c,d}. From this new set of path metrics each state, path metric element 175 selects, for each state, that path with the smallest path metric compared to the other possible paths for that state. Typically, a finite number, n, of received signal points are considered by path metric element 175 before making a decision as to the sliced subset that was received n signaling intervals before. This number n is also referred to as the "decoding depth" of the decoder. The selected sliced subset is provided by path metric element 175 to delay element 185 via lead 181. Delay element 185 compensates for the delay of the decoder and stores the previous sliced subset symbols provided by multiple slicer 165. Upon receiving the selected sliced subset from path metric element 175, delay element 185 provides the sliced subset symbol from that subset to decoder 140 via lead 186. Decoder 140 performs a symbol-to-bit mapping function and in turn yields an estimate, {$\hat{s}_k$}, of the binary sequence, {$y_k$}, transmitted by the far modem on lead 36.

As can be seen from the above equations (6a) through (6d), for each received signal point, the number of slices increases and the number of calculations, e.g., multiplications, increases directly with the number of subsets. As a result, it can be appreciated that as data rates increase to higher speeds, e.g., to provide new data services, the amount of time available to perform the slicing and the transition metrics, decreases. Consequently, at higher data rates, faster and typically more costly processing circuitry must be used to perform the required slicing and calculations for high-speed decoding.

In accordance with this invention, the number of slicing operations and calculations required for convolutional decoding is reduced by performing the transition metric calculations in reference to a single subset. As a result, the performance requirements for any convolutional decoder design are relaxed which, therefore, eases the design requirements for implementing a high-speed decoder.

Figure 4:
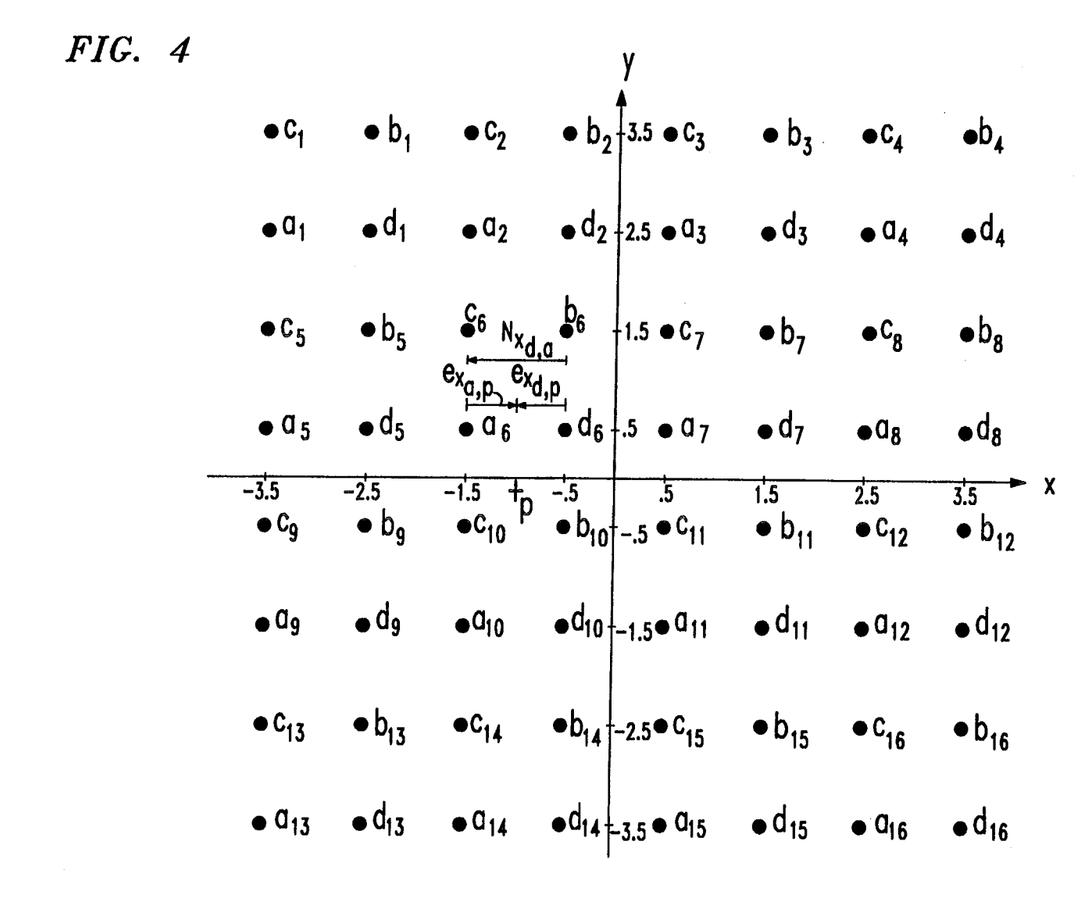
FIG. 4 applies the principles of the invention to the constellation of FIG. 2.

The constellation shown in FIG. 2 is redrawn in FIG. 4 and will be used to illustrate the principles of the invention. For simplicity, only the in-phase dimension will be discussed, a similar analysis would apply for the quadrature dimension. From equation (3) it can be seen that the transition metric $t_{i,p}$ is a function of the square of the Euclidean distance of the error, e.g., in the in-phase dimension—$e_{xi,p}{}^2$. Further, it is known that:

$$e_{xi,p}{}^2 = |e_{xi,p}|^2 \quad (7)$$

Therefore, the transition metric of equation (3) can be rewritten in terms of the magnitude of the error as:

$$t_{i,p} = |e_{xi,p}|^2 + |e_{yi,p}|^2. \quad (8)$$

Further, each component of the transition metric can be expressed as:

$$t_{xi,p} = |e_{xi,p}|^2, \text{ and} \quad (9)$$

$$t_{yi,p} = |e_{yi,p}|^2. \quad (10)$$

Figure 5:
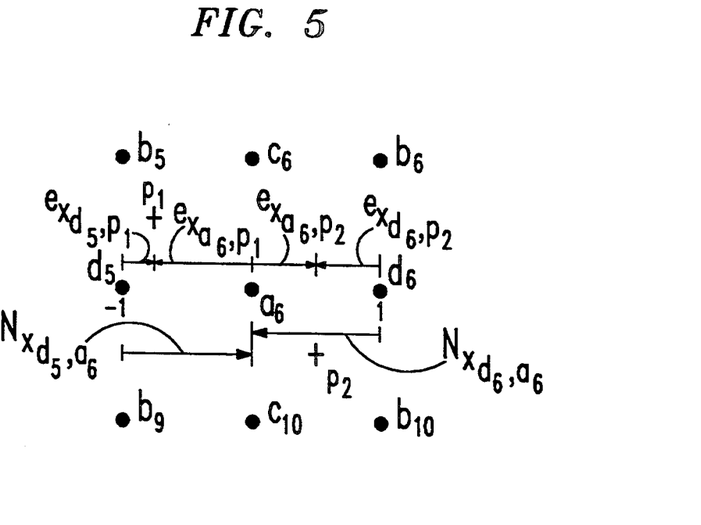
FIG. 5 illustrates the in-phase error for subset d for the constellation of FIG. 4.

An illustrative received signal point, p, is shown in FIG. 4. The closest subsets to this received signal point are: $a_6$, $d_6$, $c_{10}$ and $b_{10}$. From equation (1), the error in the in-phase dimension from each of the closest subsets shown in FIG. 4 is equal to $e_{xi,p}$. (At this point no actual slicing of the received signal point has yet been done.) However, from FIG. 4, it can be seen that each symbol of the constellation is a fixed distance, $N_{xi,j}$, from every other symbol of the constellation, where the indices i,j refer to the possible subsets, e.g., {a,b,c,d}. As a result, and in accordance with the principles of the invention, the error in the in-phase dimension for any symbol can be rewritten in terms of another of the closet symbols. For example, arbitrarily choosing subset $a_6$ as a reference subset allows equation (1) to be rewritten for subset $d_6$ as:

$$e_{xd6,p} = N_{xd6,a6} + e_{x+a6,p} \quad (11)$$

where $N_{xd,a}$ is a negative number for this particular example. Further, since equation (8) is only dependent on the magnitude of the error, equation (11) can be generally rewritten for each of the subsets as:

$$|e_{xi,p}| = ||N_{xi,a}| - |e_{xa,p}||, \quad (12)$$

where a symbol from subset a, e.g., $a_6$, is still arbitrarily chosen as the reference subset. The relationship expressed by equation (12) is shown in FIG. 5 for two illustrative received signal points, $p_1$ and $p_2$. Similarly, for the quadrature dimension:

$$|e_{yi,p}| = ||N_{yi,a}| - |e_{ya,p}||. \quad (13)$$

Therefore, and in accordance with the principles of the invention, the number of slicing operations can be reduced by expressing the error, or Euclidean distance, for any closest subset as a function of an arbitrarily picked reference subset, i.e., $$e_{xi,p} = f(N_{xi,r}, e_{xr,p}), \text{ and} \quad (14)$$

$$e_{yi,p} = f(N_{yi,r}, e_{yr,p}), \quad (15)$$

where $N_{xi,r}$ is the in-phase distance between a reference subset r and subset i, and $e_{xr,p}$ is the in-phase error from the reference subset r. Similarly for the quadrature dimension, $N_{yi,r}$ is the quadrature distance between a reference subset r and subset i, and $e_{yr,p}$ is the quadrature error from the reference subset r.

Since the error for any particular subset can be expressed in terms of an arbitrarily chosen reference subset, equation (12) can be substituted within equation (9):

$$t_{xi,p} = N_{xi,a}^2 - 2|N_{xi,a}||e_{xa,p}| + e_{xa,p}^2, \quad (16)$$

From this an adjusted transition metric can be defined by subtracting $e_{xa,p}^2$:

$$t_{xi,p}^a = t_{xi,p} - e_{xa,p}^2, \quad (17a)$$

$$t_{xi,p}^a = N_{xi,a}^2 - 2|N_{xi,a}||e_{xa,p}|, \quad (17b)$$

where the superscript a in $t_{xi,p}^a$ indicates an adjusted transition metric that uses subset a as the reference subset. Similarly, in the quadrature dimension:

$$t_{yi,p}^a = N_{yi,a}^2 - 2|N_{yi,a}||e_{ya,p}|, \quad (18)$$

Equations (17) and (18) yields the following adjusted transition metrics for each of the sliced subsets:

$$t_{a,p}^a = 0, \text{ (from the definition of } t_{a,p}^a\text{)}, \quad (19a)$$

$$t_{c,p}^a = 1 - 2|e_{ya,p}|, \text{ (since } N_{xc,a} = 0 \text{ and } |N_{yc,a}| = 1), \quad (19b)$$

$$t_{d,p}^a = 1 - 2|e_{xa,p}|, \text{ (since } |N_{xd,a}| = 1 \text{ and } N_{yd,a} = 0), \text{ and} \quad (19c)$$

$$t_{b,p}^a = t_{c,p}^a + t_{d,p}^a, \text{ (since } |N_{xd,a}| = 1 \text{ and } |N_{yc,a}| = 1) \quad (19d)$$

where equation (19d) results from the observation that the in-phase and quadrature components of $t_{b,p}^a$, are respectively equal to the in-phase error for subset d, $e_{xd,p}$, and the quadrature error for subset c, $e_{yc,p}$.

From equation (19), it can be seen that the number of slices is reduced to a single error computation of reference subset a and the complexity of the calculations is simplified when computed with equation (6). However, the calculation of the branch metrics can be further simplified, in accordance with a feature of the invention, by the use of "modulo" arithmetic.

Figure 6:
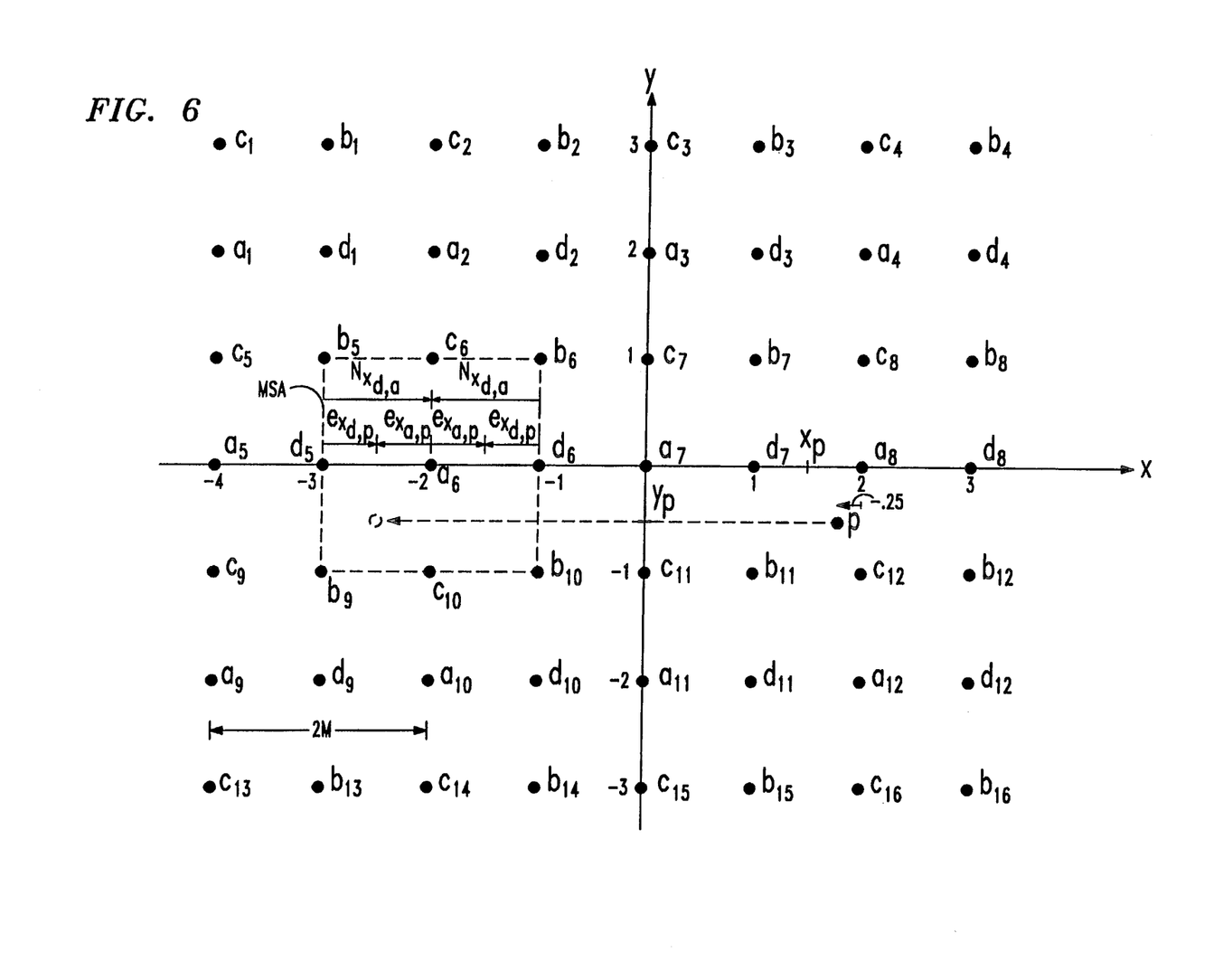
FIG. 6 shows a modulo set area for the constellation of FIG. 4 in accordance with the principles of the invention.

The illustrative constellation of FIG. 4 is redrawn in FIG. 6, where illustratively, subset a is again chosen as the reference subset and for convenience the constellation of FIG. 4 is redrawn with a symbol from subset a at the origin. In using modulo arithmetic, a "modulo set area" (MSA) is constructed by first arbitrarily picking a subset symbol to serve as the reference point. Continuing with the example from FIG. 4, subset symbol $a_6$ is chosen. After selecting the reference subset, the "modulo base," M, is calculated. The modulo base, M, is defined as half the distance between the two closest symbols in a subset. From FIG. 6, it can it can be seen that M=1. After determining the modulo base, the MSA is constructed around the reference subset, $a_6$, with dimensions 2M by 2M. Within the MSA, the absolute value of the reference error is less than or equal to M and the distances from the received signal point to the closest subset symbol remains unchanged. For the MSA shown in FIG. 6, the size is 2 by 2, and the absolute value of the reference error is less than or equal to 1. If a received signal point falls within the MSA, the calculations for the transition metrics are performed in reference to subset $a_6$ as described above. However, if the received signal point falls outside of the MSA, modulo arithmetic is used to "fold" the received signal point into the MSA. As a result, no initial slicing operation has to be performed and any arbitrary reference subset symbol can be used from a constellation.

This situation is shown in FIG. 6, where a received signal point p is shown outside of the MSA. The closest symbol from the a subset is $a_8$. The error in the in-phase dimension, taken from FIG. 6 is equal to:

$$e_{xa,p} = x_p - x_{a8} = 1.75 - 2 = -0.25. \quad (20)$$

Figure 7:
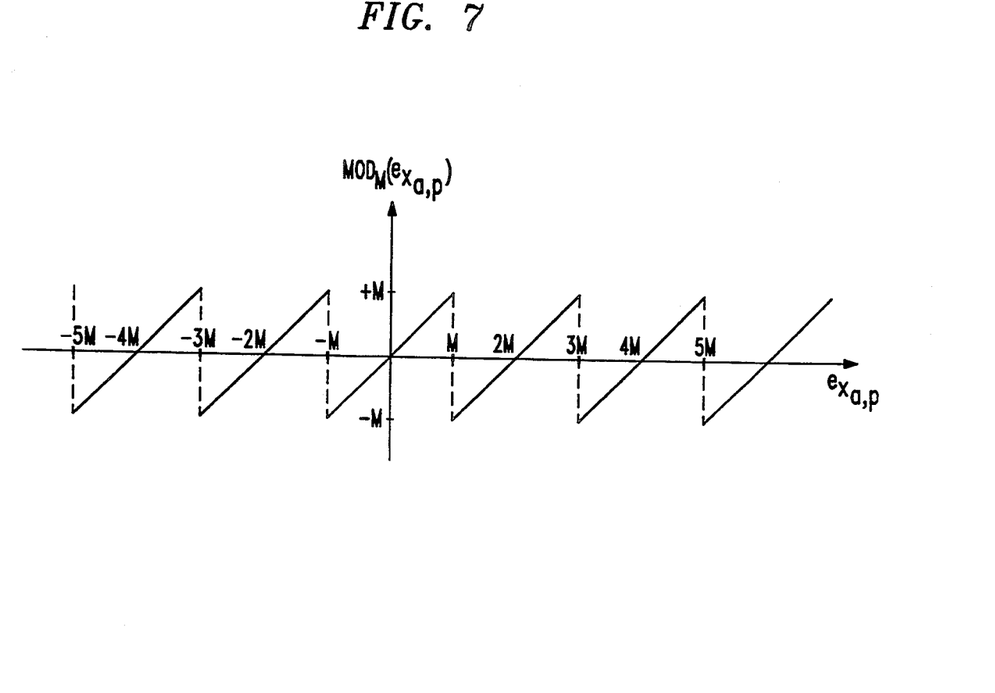
FIG. 7 is a graphical representation of a wrap-around modulo operation in accordance with the principles of the invention.

However, a "wrap-around modulo" M operation can be defined that maintains the error relationship between the received signal point p and the subset a. This allows the arbitrarily chosen reference subset, here $a_6$, to be used independent of any received signal point. Once the received signal point is within the MSA, every subset is now represented by a single symbol from that subset. This wrap-around modulo operation is:

$$e_{xa,p} = Mod_M(e_{xa_r,p}), \quad (21)$$

where the subscript r from $e_{xa_r,p}$ represents the subset chosen as the reference subset. A similar equation exists for the quadrature dimension. The wrap-around modulo operation of equation (21) is shown in FIG. 7. Within the context of this example, M=1, therefore, using equation (21) and subset $a_6$ as the reference subset, yields:

$$e_{xa,p} = Mod_1(e_{xa6,p}), \quad (22)$$

$$e_{xa,p} = Mod_1(1.75 - (-2)), \quad (23)$$

$$e_{xa,p} = Mod_1(3.75), \quad (24)$$

$$e_{xa,p} = -0.25. \quad (25)$$

In addition, it can be observed that by shifting the constellation to the origin in FIG. 6, equation (21) can be further simplified to:

$$e_{xa,p} = Mod_M(x_p), \quad (26)$$

where $x_p$ is the in-phase coordinate of the received signal point. Continuing with the example from FIG. 6:

$$e_{xa,p} = Mod_1(x_p), \quad (27)$$

$$e_{xa,p} = Mod_1(1.75) = -0.25, \quad (28)$$

which again, is the same result as equation (20). Note that since the reference point is at (0,0), the error values are determined without any slicing operation, i.e., there is no need to perform a slicing operation. Similarly for the quadrature dimension:

$$e_{ya,p} = Mod_1(y_p). \quad (29)$$

Equation (28) (or equation (25)) yields the same result as equation (20) but uses an arbitrary reference subset. In effect, the received signal point is "folded" into an MSA around the arbitrarily picked reference subset. In comparison to the conventional convolutional decoder, which performs its operations centered around the received signal point, the modulo decoder folds the signal space into a small area—the modulo set area, which uses one arbitrary symbol from an arbitrary subset as the reference point from which the branch, or transition, metrics are determined. The resulting values that are computed are not absolute, but are rather relative to the reference symbol. As a result, there is no need for k slices and only a single slicing need be performed which can occur at the last stage of the decoding. Further, by using the modulo decoder the distance to the closest symbol is automatically computed notwithstanding the fact that the calculations are not directly determining the actual symbol.

Figure 8:
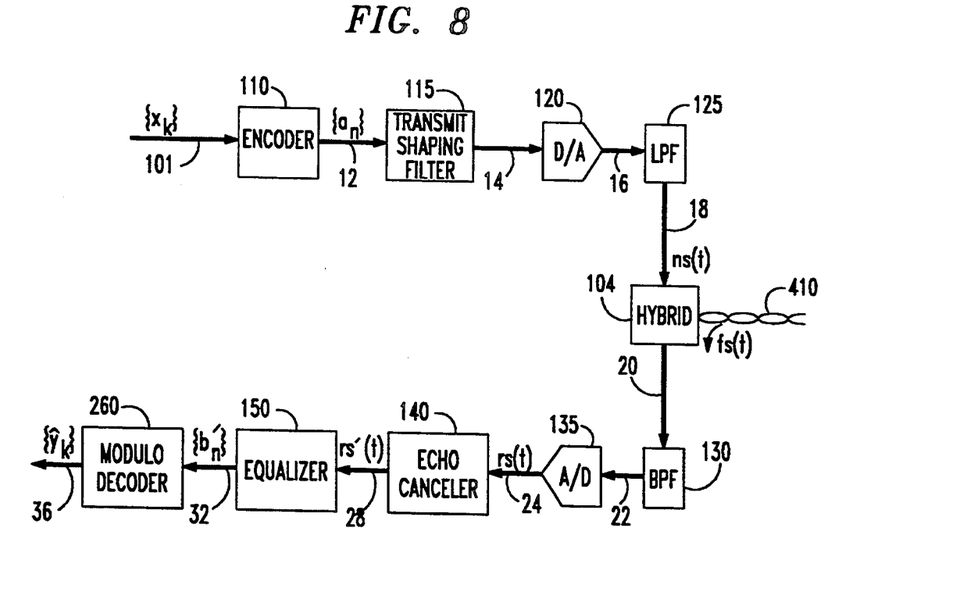
FIG. 8 is a block diagram of a modem structure embodying the principles of the invention.

An embodiment of the invention is shown in FIG. 8. In accordance with the invention, decoder 160 of FIG. 1 is replaced by modulo decoder 260, all other components of FIG. 8 function as described above.

Figure 9:
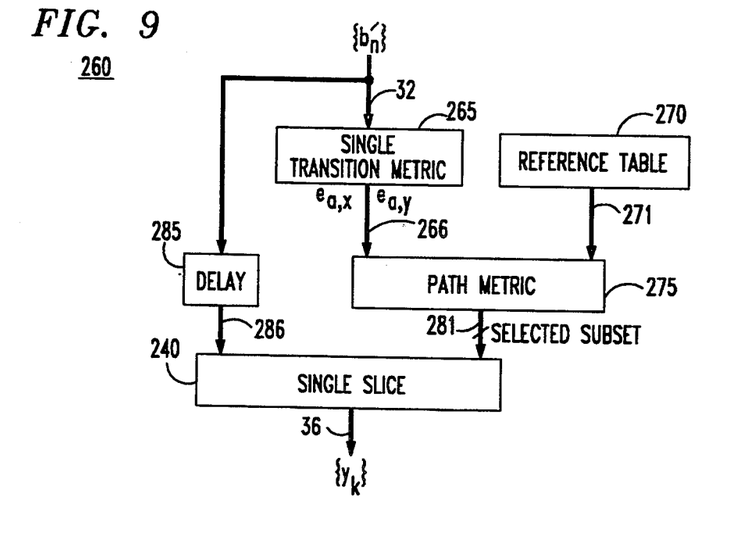
FIG. 9 is a block diagram of a modulo decoder used in the modem structure of FIG. 8.

An illustrative block diagram of modulo decoder 260 is shown in FIG. 9 and comprises single transition metric element 265, reference table element 270, path metric element 275, delay element 285 and single slice element 240. Within modulo decoder 260, the received signal point is applied to single transition metric element 265 and delay element 285. The latter stores the received signal point until the calculations are completed by the remainder of modulo decoder 260, at which time the received signal point is applied to single slice element 240 (discussed below). Single transition metric element 265 performs a single transition metric, i.e., the error with respect to an arbitrary subset using modulo decoding discussed above. Reference table element 270 holds the reference metric values required for computation, i.e., the fixed relationships of the other subsets in reference to the chosen reference subset, e.g., $N_{xi,r}, N_{yi,r}$. The single transition metric, from single transition metric element 265 and the reference metric values from reference table 270 are applied to path metric element 275. The latter computes the shortest path in a similar fashion to conventional convolutional decoding by using the above-mentioned single transition metric and reference table values to determine the various transition metrics. Path metric element 275 selects the smallest path metric from the sums of the transition metrics and the previous path metrics to generate a new path metric. Path metric element 275 provides the selected subset for the symbol received n signaling intervals before on lead 280. Single slice element 240 receives the selected subset from lead 280 and the prior received signal point via lead 286 from delay element 285 to perform one slicing operation to the nearest symbol from the selected subset. Therefore, only a single slicing is performed at the end of the decoding operation. Finally, single slice element 240 performs a symbol-to-bit mapping function and in turn yields an estimate, $\{y_k\}$, of the binary sequence, $\{Y_k\}$, transmitted by the far modem on lead 36.

The principles of this invention can be applied to any constellation. An additional example is shown for the constellation of FIG. 10, which has the indicated modulo set area. In this constellation there are eight subsets: {a,b,c,d,e,f,g,h}, which are all folded into the modulo set area that is again, for the purposes of this example, centered about subset a. From the spacing of the subsets, it can be determined that M=2. As a result, subset points {a,b,c,d} will be treated as before with the exception of doubling the value of $N_{xi,r}$ and $N_{yi,r}$ due to the increase in the modulo set area. However, the other four subset points, {e,f,g,h}, require conditional operations, as described below.

Figure 10:
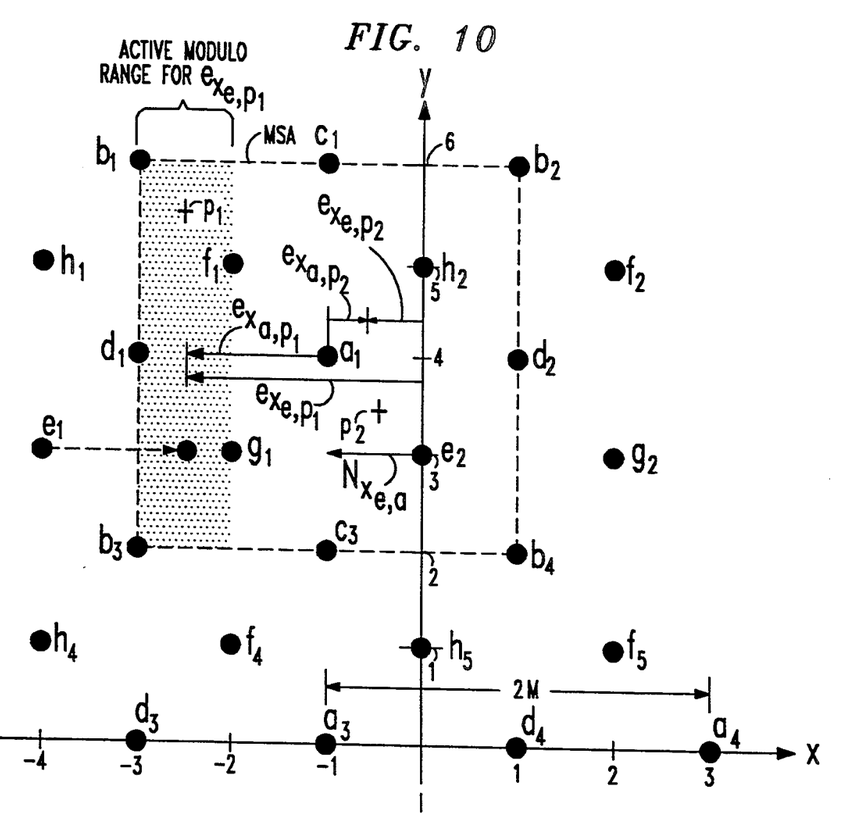
FIG. 10 is another illustrative constellation used in the modem structure of FIG. 8.

The MSA of FIG. 10 depicts the errors in the inphase dimension only (a similar analysis applies for the quadrature dimension). For subsets {a,b,c, and d} the error is calculated with respect to $e_{xa,p}$, which (from equation (26)) is equal to:

$$e_{xa,p} = Mod_2(x_p), \quad (30)$$

where the received signal point is folded into the MSA by performing a wrap-around modulo 2 operation on the error with respect to the arbitrarily picked reference subset. Therefore, using a similar analysis applied to the constellation of FIG. 6, and equation (17) the following adjusted transition metrics result:

$$t_{a,p}{}^a = 0, \text{ (from the definition of } t_{a,p}{}^a), \quad (31a)$$

$$t_{c,p}{}^a = 4 - 4|e_{ya,p}|, \text{ (since } N_{xc,a}=0 \text{ and } |N_{yb,a}|=2), \quad (31b)$$

$$t_{d,p}{}^a = 4 - 4|e_{xa,p}|, \text{ (since } |N_{xc,a}|=2 \text{ and } N_{yb,a}=0), \text{ and} \quad (31c)$$

$$t_{b,p}{}^a = t_{c,p}{}^a + t_{d,p}{}^a. \quad (31d)$$

However, the equations for the adjusted transition metrics for the other four subsets {e,f,g,h} are treated differently in accordance with their spatial relationship between the reference subset and the MSA. Illustratively, the adjusted transition metric for subset e will be computed, similar steps are taken to compute the other three adjusted transition metrics.

$$t_{e,p}{}^a = t_{xe,p}{}^a + t_{ye,p}{}^a, \quad (32)$$

$$t_{xe,p} = e_{xe,p}{}^2 = [Mod_2(e_{xa\ p})]^2, \quad (33)$$

However, a modulo 2 operation must be performed on the error, before squaring it. In this case, the range of values for $e_{xa\ p}$ will yield different equations to evaluate $e_{xe,p}$. From FIG. 10, for subset e, it is shown that there are two ranges over which the following relationships can be defined for calculating $e_{xe,p}$:

first range: $|N_{xe,a} + e_{xa,p}| \leq M$ $$e_{xe,p} = N_{xe,a} + e_{xa,p} \quad (34a)$$

second range: $|N_{xe,a} + e_{xa,p}| \geq M$ $$e_{xe,p} = 2M + N_{xe,a} + e_{xa,p}, \quad (34b)$$

where $N_{xe,a} < 0$.

The MSA is broken into two ranges because of the shape of this illustrative constellation, i.e., in the area delineated as the second range, the error to subset e is properly represented by the distance from $e_1$. As a result, the value of 2M is included within equation (34b).

Similarly for the quadrature dimension:
first range: $|N_{ye,a} + e_{ya,p}| \leq M$ $$e_{ye,p} = N_{ye,a} + e_{ya,p}, \quad (35a)$$

second range: $|N_{ye,a} + e_{ya,p}| \geq M$, $$e_{ye,p} = -2M + N_{ye,a} + e_{ya,p}, \quad (35b)$$

Note that equation (35a) is similar to equation (34a) but since $N_{ye,a} > 0$ equation (34b) and equation (35a) differ in the sign of 2M.

From equations (34a) and (34b), the following adjusted transition metrics for the in-phase dimension result:

first range: $[N_{xe,n}+e_{xa,p}] \leq M$ $$t_{xe,p}{}^a = N_{xe,a}{}^2 + 2N_{xe,a}e_{xa,p}. \qquad (36a)$$

second range: $|N_{xe,a}+e_{xa,p}| \geq M$ $$t_{xe,p}{}^a = [2M+(N_{xe,a}+e_{xa,p})]^2 - e_{xa,p}{}^2. \qquad (36b)$$

Substituting the appropriate values of $M=2$ and $N_{xe,a}=-1$ into equations (36a) and (36b) simplifies them to:

first range: $e_{xa,p} \geq -1$ $$t_{xe,p}{}^a = 1 - 2e_{xa,p}. \qquad (37a)$$

second range: $e_{xa,p} \leq -1$ $$t_{xe,p}{}^a = 9 + 6e_{xa,p}. \qquad (37b)$$

Similarly for the quadrature dimension (but with $N_{ye,a}=1$):

first range: $e_{ya,p} \leq 1$ $$t_{ye,p}{}^a = 1 + 2e_{ya,p}. \qquad (38a)$$

second range: $e \geq 1$ $$t_{ye,p}{}^a = 9 - 6e_{ya,p}. \qquad (38b)$$

Points f, g, and h are computed in the same conditional fashion as point e, but with different $N_{xi,a}$ and $N_{yi,a}$ values. These $N_{xi,a}$ and $N_{yi,a}$ values are still in reference table 270 and are used during the computation.

Each of the above equations was evaluated with respect to the in-phase coordinate, a similar analysis is appropriate for the quadrature coordinate. This same analysis can also be applied to subsets a,b,c,d, but since $N=M$, it is a special case where the two ranges are folded into one.

In accordance with the principles of the invention, described above, the design of a convolutional decoder is simplified e.g., the complexity of the transition metric is in the definition of the reference table, not the actual operation. As a result, all the previous operations of the transition metric computations can be collapsed into the path metric operation.

The foregoing merely illustrates the principles of the invention and it will thus be appreciated that those skilled in the art will be able to devise numerous alternative arrangements which, although not explicitly described herein, embody the principles of the invention and are within its spirit and scope.

For example, although the inventive concept was described in the context of an echo canceling modem, the inventive concept can be applied to any communications system where convolutional decoding is required. Further, the inventive concept is applicable to a finite constellation since the boundary conditions can be taken into account by appropriate inclusion in the reference table.

In addition, although the invention is illustrated herein as being implemented with discrete functional building blocks, e.g., echo cancelers, equalizers, etc., the functions of any one or more of those building blocks can be carried out using one or more appropriate programmed processors.

I claim:

1. A method comprising the steps of
receiving a sequence of signal points that represent a sequence of transmitted symbols, each symbol of said sequence of transmitted symbols being selected in accordance with a convolutional code from a constellation comprising a plurality of subsets, each subset comprising a plurality of symbols, and decoding the received sequence of signal points to provide a sequence of received symbols which represent an estimate of the sequence of transmitted symbols, where the decoding step includes a step of calculating a transition metric for each subset of said constellation for each one of the received signal points, where at least one of this plurality of transition metrics for a respective subset is calculated as a function of an error metric of a different subset.

2. The method of claim 1 where at least one of the plurality of transition metrics is determined with respect to a modulo set area of the constellation, and where said modulo set area is centered about one symbol of the constellation, the size of the modulo set area being equal to 2M by 2M, where M is half the distance between the two closest symbols of the subset from which said one symbol is taken and $M>0$.

3. The method of claim 1 wherein the decoding step performs only one slicing operation for each received signal point from the sequence of received signal points, each said slicing operation selecting a received symbol to provide the sequence of received symbols.

4. The method of claim 1 wherein the constellation is an infinite grid constellation.

5. Apparatus for receiving a signal comprising:
means for receiving the signal to provide a received sequence of signal points,
means for calculating a reference error metric for each one of the sequence of received signal points, said reference error metric determined in reference to a predefined symbol taken from a constellation comprising a plurality of subsets, each subset comprising a plurality of symbols, and
means for decoding the received sequence of signal points to provide a received data sequence,
where said means for decoding calculates a plurality of transition metrics for each one of the plurality of subsets for each one of the received sequence of signal points, where each one of the plurality of transition metrics is calculated in reference to said reference error metric.

6. The apparatus of claim 5 wherein the decoding means performs one slicing operation for each one of the received signal points.

7. The apparatus of claim 5 wherein the constellation is an infinite grid constellation.

8. Apparatus for receiving a signal, comprising
means for receiving the signal to provide a received sequence of signal points,
means for decoding the received sequence of signal points to select for each one of the received sequence of signal points a subset from a constellation comprising a plurality of subsets, each subset comprising a plurality of symbols, and
means for performing no more than one slicing operation on each one of the received sequence of signal points in response to the respective selected subset to select a symbol from said constellation.

9. The apparatus of claim 8 wherein the means for decoding performs modulo decoding.

* * * * *